(12) United States Patent
Hazelton et al.

(10) Patent No.: US 6,285,438 B1
(45) Date of Patent: Sep. 4, 2001

(54) SCANNING EXPOSURE METHOD WITH REDUCED TIME BETWEEN SCANS

(75) Inventors: Andrew J. Hazelton, San Carlos; Bausan Yuan, San Jose, both of CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/314,146

(22) Filed: May 19, 1999

(51) Int. Cl.$^7$ .......................... G03B 27/42; G03B 27/32
(52) U.S. Cl. .................................. 355/53; 355/77
(58) Field of Search ..................... 355/50, 53, 55, 355/67, 77; 356/399–401; 250/548; 430/5, 22

(56) References Cited

U.S. PATENT DOCUMENTS

| 4,641,071 | 2/1987 | Tazawa et al. ............... 318/640 |
| 5,477,304 | 12/1995 | Nishi ............................ 355/53 |
| 5,483,311 | 1/1996 | Sakakibara et al. ........... 355/53 |
| 5,617,182 | 4/1997 | Wakamoto et al. ........... 355/53 |
| 5,677,754 | 10/1997 | Makinouchi .................... 355/5 |
| 5,715,064 | 2/1998 | Lin ............................. 356/401 |
| 5,726,754 | 3/1998 | Andrews et al. .............. 356/357 |
| 5,877,845 | * | 3/1999 | Makinouchi .................... 355/53 |
| 5,906,901 | * | 5/1999 | Tanimoto ...................... 430/22 |
| 5,981,116 | * | 11/1999 | Ota .............................. 430/22 |
| 5,995,203 | * | 11/1999 | Ueda ............................ 355/67 |

FOREIGN PATENT DOCUMENTS

| 0 785 571 A2 | 7/1997 | (EP) . |
| 7-161614 | 6/1995 | (JP) . |

\* cited by examiner

*Primary Examiner*—Russell Adams
*Assistant Examiner*—Hung Henry Nguyen
(74) *Attorney, Agent, or Firm*—Finnegan, Henderson, Farabow, Garrett & Dunner, L.L.P.

(57) ABSTRACT

A positioning method in which a system performs operations relative to areas on a substrate by a series of relative movements between the system and substrate scanning exposures. The method includes the steps of disposing a first area relative to a system performing an operation relative to the first area, and moving the substrate from a first position where the first operation relative to the first area has finished to a second position where a second operation relative to a second area is to start, and synchronously moving the system from a third position where the first operation relative to the first area has finished to a fourth position where the second operation relative to the second area is to start. An acceleration of the substrate during movement from the first position to the second position and an acceleration of the system during movement from the third position to the fourth position continually have absolute values greater than zero.

7 Claims, 7 Drawing Sheets

SCANNING EXPOSURE METHOD WITH REDUCED TIME BETWEEN SCANS

BACKGROUND OF THE INVENTION

1. Field of the Invention

The present invention relates to a scanning exposure method of the step-and-scan type in which a mask and a substrate are synchronously scanned to transfer a mask pattern onto the substrate. More specifically, the invention relates to such a scanning exposure method in which the time between scans of the pattern is reduced.

2. Discussion of the Related Art

In a photolithography process for manufacturing a semiconductor or the like, a projection-type exposure apparatus uses a projection optical system to transfer an image of a pattern on a mask or a reticle to a photosensitive substrate. The substrate typically is a wafer or glass plate with photoresist applied thereto. During the process, a much larger pattern on the reticle is transferred to the wafer. For example, a reticle pattern may be about four times the size of the transferred image to the wafer. Various scanning-type exposure apparatuses have been developed in which the reticle and the wafer are scanned synchronously with respect to an illumination area, often a slit-like illumination area, to transfer the large pattern to the wafer.

More particularly, a wafer includes a plurality of shot areas or chips on which a reticle pattern is scanned and exposed. After scanning and exposing a reticle pattern onto a first shot area of a wafer, the wafer and reticle must be stepped to the next shot area and pattern, respectively, to begin the scanning of that next pattern. The stepping of the wafer positions the subsequent shot area to a scanning start position. Often, during the stepping of the wafer, the direction of scanning must be reversed. The stepping and scanning exposure is repeated for all shot areas on the wafer. This system of repeating the stepping and the scanning exposure is commonly called a step-and-scan system.

U.S. patent application Ser. No. 08/356,619, filed Dec. 7, 1994, discloses a step-and-scan system, and is hereby incorporated by reference. As shown at FIGS. 7(a), 7(b), and 7(c), the disclosed system illustrates a velocity wave form having linear velocity segments.

In the step-and-scan system, the stepping time between scans represents an inefficiency in which no scanning occurs. This inefficiency increases the total time to manufacture a chip on a wafer and thereby limits the throughput of wafers in a production process. The need therefore exists to minimize the stepping time between scans to increase wafer throughput.

SUMMARY OF THE INVENTION

Objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, the invention comprises a step-and-scan exposure method in which patterns on a mask are transferred to shot areas on a photosensitive substrate by a series of scanning exposures. The method includes the steps of disposing a first shot area under a projection optical system and a first pattern above the projection optical system, exposing the first pattern onto the first shot area through the projection optical system, and moving the substrate from a first position where the exposure of the first pattern onto the first shot area has finished to a second position where the exposure of a second pattern onto a second shot area is to start, and synchronously moving the mask from a third position where exposure of the first pattern onto the first shot area has finished to a fourth position where exposure of the second pattern onto the second shot area is to start. An acceleration of the substrate during movement from the first position to the second position and an acceleration of the mask during movement from the third position to the fourth position continually have absolute values greater than zero.

According to another aspect, the invention comprises a step-and-scan exposure method in which patterns on a mask are transferred to shot areas on a photosensitive substrate by a series of scanning exposures. The method includes the steps of disposing a first shot area under a projection optical system, exposing a first pattern onto the first shot area through the projection optical system, and moving the substrate from a first position where the exposure of the first pattern onto the first shot area has finished to a second position where the exposure of a second pattern onto a second shot area is to start. An acceleration of the substrate during movement from the first position to the second position continually has an absolute value greater than zero.

According to a further aspect, the invention comprises a step-and-scan exposure method in which patterns on a mask are transferred to shot areas on a photosensitive substrate by a series of scanning exposures. The method includes the steps of disposing a first pattern above a projection optical system, exposing the first pattern onto a first shot area through the projection optical system, and moving the mask from a first position where the exposure of the first pattern has finished to a second position where the exposure of a second pattern onto a second shot area is to start. An acceleration of the mask during movement from the first position to the second position continually has an absolute value greater than zero.

It is to be understood that the foregoing general description and the following detailed description are exemplary and explanatory only and are not restrictive of the invention as claimed.

BRIEF DESCRIPTION OF THE DRAWINGS

The accompanying drawings are included to provide a further understanding of the invention and are incorporated in and constitute part of the specification, illustrate preferred embodiments of the invention, and, together with a description, serve to explain the principles of the invention.

DETAILED DESCRIPTION OF THE PREFERRED EMBODIMENTS

Reference will be made in detail to the present preferred embodiments of the invention, examples of which are illustrated in the accompanying drawings. Like reference numerals refer to like parts in the various figures of the drawings.

Apparatus and methods consistent with the invention are directed toward performing operations involving a series of relative position changes between a substrate and a system. The operation incorporates a single, continuous deceleration and acceleration step during a change in direction between operations.

One embodiment of the invention is directed to a scanning exposure of a step-and-scan method. The scanning exposure incorporates a single, continuous deceleration and acceleration step during the change in direction of a wafer stage or reticle stage between individual scans of a wafer shot area. This single step increases wafer throughput without adversely affecting the dynamics of wafer or reticle stage motion or the velocity profiles of the stages during the scan.

Various conventional projection exposure apparatuses may be used in connection with the step-and-scan method according to the present invention. The structure of one such projection exposure apparatus is shown and described in U.S. Pat. No. 5,617,182, the complete disclosure of which is incorporated by reference herein. The projection exposure apparatus described in that patent will be used for illustrative purposes. It is to be understood that the step-and-scan method according to the present invention may be used with various other projection exposure apparatuses known in the art.

Figure 1:
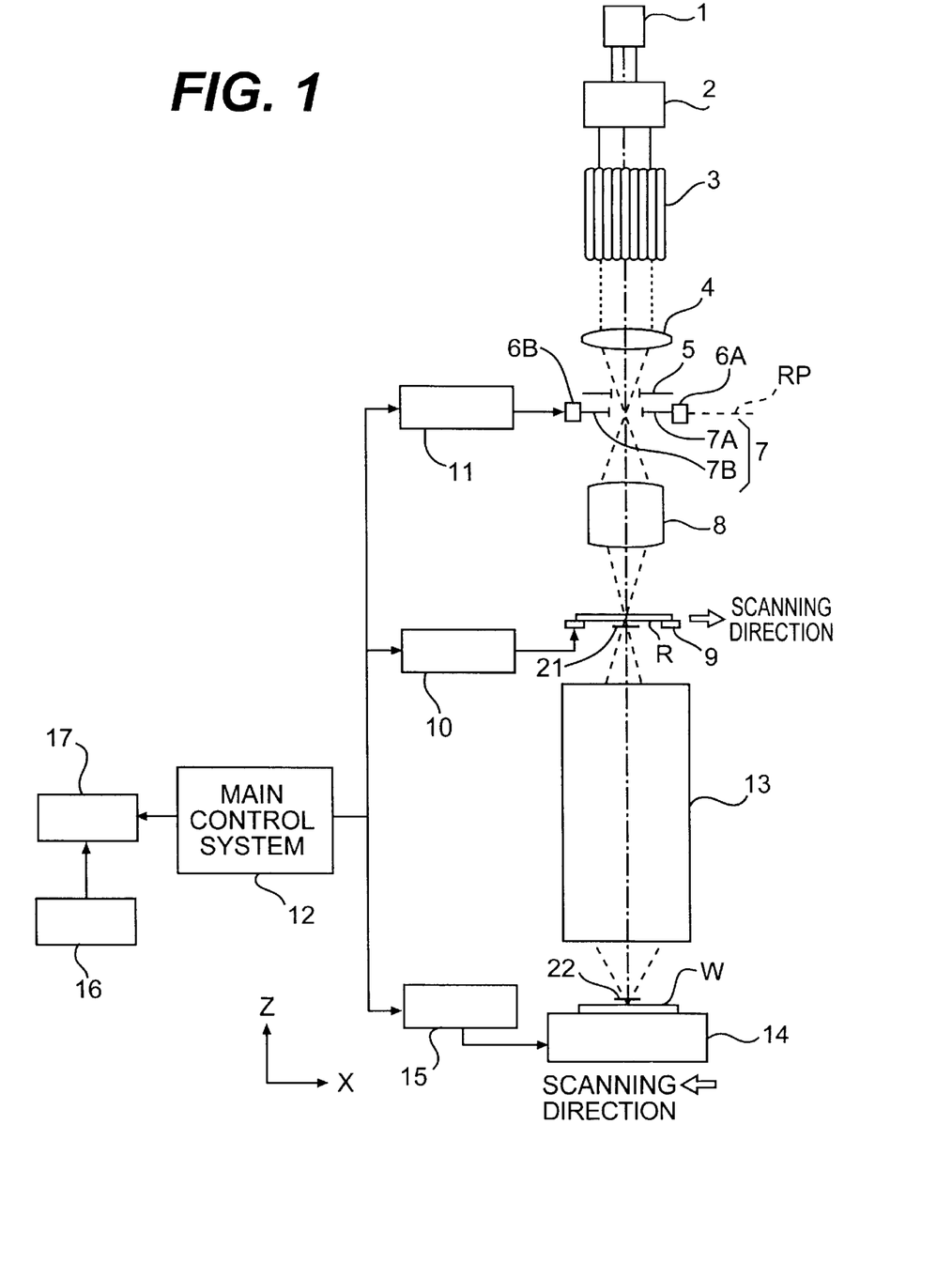
FIG. 1 is a schematic diagram of an embodiment of a projection exposure apparatus for use in a step-and-scan method according to the present invention.
Figure 2:
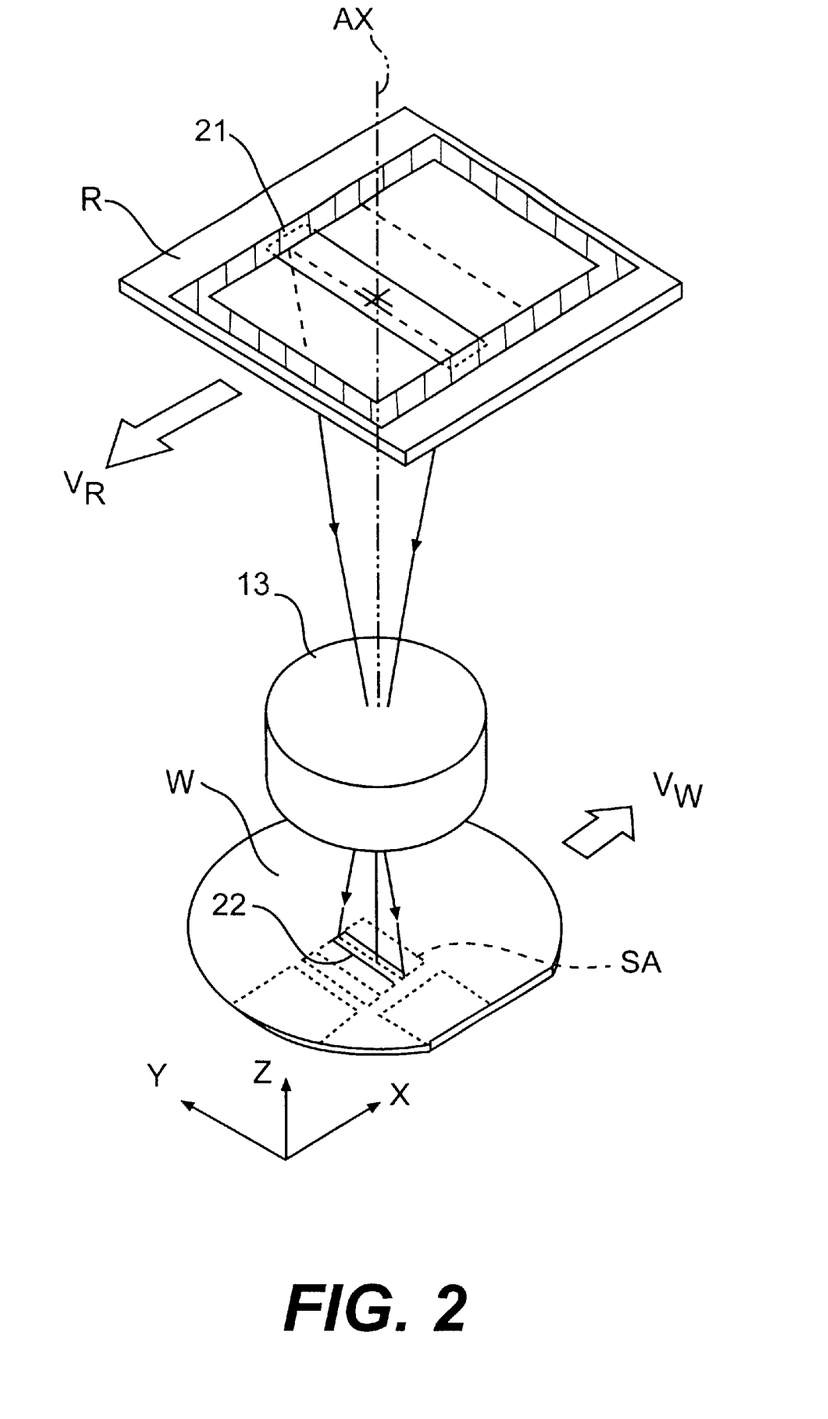
FIG. 2 is a perspective view of a portion of the projection exposure apparatus of FIG. 1.

FIGS. 1 and 2 show the projection exposure apparatus described in U.S. Pat. No. 5,617,182. The general structure and operation of that conventional apparatus will be described below, followed by a more detailed description of the step-and-scan method according to the present invention.

In FIG. 1, light from a light source 1 illuminates a reticle R with uniform illuminance via an illumination optical system. The optical system includes a shaping optical system 2, a fly eye lens 3, a condenser lens 4, a fixed field stop 5, drive section 6A and 6B, a movable blind 7, and a relay lens system 8. The image of a circuit pattern of the reticle R within a rectangular slit-like illumination area 21 projects onto a wafer W via a projection optical system 13. The light source 1 may be any suitable light source known in the art, including the various light sources disclosed in U.S. Pat. No. 5,617,182, and may be controlled by any suitable means known in the art, including those described in that patent.

With further reference to FIG. 1, the diameter of the light flux from light source 1 is set to a predetermined value by means of shaping optical system 2. The light from shaping optical system 2 reaches fly eye lens 3. A plurality of secondary light sources are formed on the exit surface of fly eye lens 3 and the light from the secondary light sources is condensed by condenser lens 4 to reach movable blind (variable field stop) 7 via fixed field stop 5.

A rectangular slit-like opening is formed in field stop 5. The light passed through field stop 5 becomes a light flux having a rectangular slit-like cross section and enters relay lens system 8. Relay lens system 8 is a lens system for making movable blind 7 and the pattern surface of reticle R conjugate to each other. Field stop 5 is disposed in a vicinity of movable blind 7. Movable blind 7 has a plurality of movable blades by which a rectangular opening is formed. For example, movable blind 7 may include two blades (light-shielding plates) 7A and 7B for defining the width of the rectangular opening in a scanning direction (X direction) and two blades (not shown) for defining the width of the rectangular opening in a non-scanning direction (Y direction) perpendicular to the scanning direction. Blades 7A and 7B for defining the width in the scanning direction are supported so as to be driven separately in the scanning direction by the respective drive sections 6A and 6B, and the blades for defining the width in the non-scanning direction are supported so as to be driven separately. Within slit-like illumination area 21 on reticle R set by field stop 5, only a desired area set by movable blind 7 is illuminated with the light from light source 1. That is, movable blind 7 varies the widths of illumination area 21 in the respective scanning and non-scanning directions. Relay lens system 8 is a both-side telecentric optical system, and telecentric characteristics are maintained in slit-like illumination area 21 on reticle R.

Reticle R is disposed on a reticle stage 9 and the image of the circuit pattern within slit-like illumination area 21 on reticle R and the area limited by movable blind 7 is projected to wafer W via projection optical system 13. An area (projection area of the circuit pattern) on wafer W conjugate to slit-like illumination area 21 is a slit-like exposure area 22. Also, within a two-dimensional plane perpendicular to the optical axis of projection optical system 13, the scanning direction of reticle R with respect to slit-like illumination area 21 is a +X direction (or −X direction) and a direction parallel to the optical axis of projection optical systems 13 is determined as a Z direction.

Reticle stage 9 is driven by a drive section 10. At the time of the scanning exposure, reticle R is scanned (constant movement) in the scanning direction (+X direction or −X direction). In parallel with this scanning operation, a control section 11 controls operations of the blinds 7A and 7B as well as drive sections thereof for the non-scanning direction. Drive section 10 and control section 11 are controlled by a main control system 12 for controlling the whole operation of the apparatus.

Wafer W is disposed on a wafer stage 14. Wafer stage 14 is an XY stage for positioning wafer W in a plane perpendicular to the optical axis of projection optical system 13 and scanning (constant movement) wafer W in the ±X direction and a Z stage for positioning the wafer W in the Z direction. Main control system 12 controls positioning and scanning operations of wafer stage 14 via a drive section 15.

As shown in FIG. 2, when transferring the image of the pattern on reticle R to each shot area on wafer W, reticle R is scanned at a speed $V_R$ in the −X direction (or +X direction) with respect to slit-like illumination area 21. Also, the magnification of projection optical system 13 is set to $\beta$, which corresponds to relative size of the reticle pattern and the corresponding shot area. In synchronism with the scanning of reticle R, wafer W is scanned at a speed $V_W (= \beta \times V_R)$ in the +X direction (or −X direction) with respect to the slit-like exposure area 22. Thereby, the image of the circuit pattern of reticle R is transferred to the shot area SA on wafer W.

Main control system 12 controls the exposure sequence. The arrangement of the image pattern of reticle R is first input via an input device 16, such as a keyboard, into a memory 17. Main control system 12 then reads the pattern information from memory 17 prior to determining the exposure sequence. In addition, the arrangement of shot areas on wafer W can be obtained by detecting positions of several alignment marks provided on each shot area and performing statistical calculation of these positions with highly precise position sensors. The data defining the arrangement of shot areas may also be stored in memory 17. A more detailed description of the operation of the control system will be provided further herein in connection with FIGS. 6 and 7.

Figure 3:
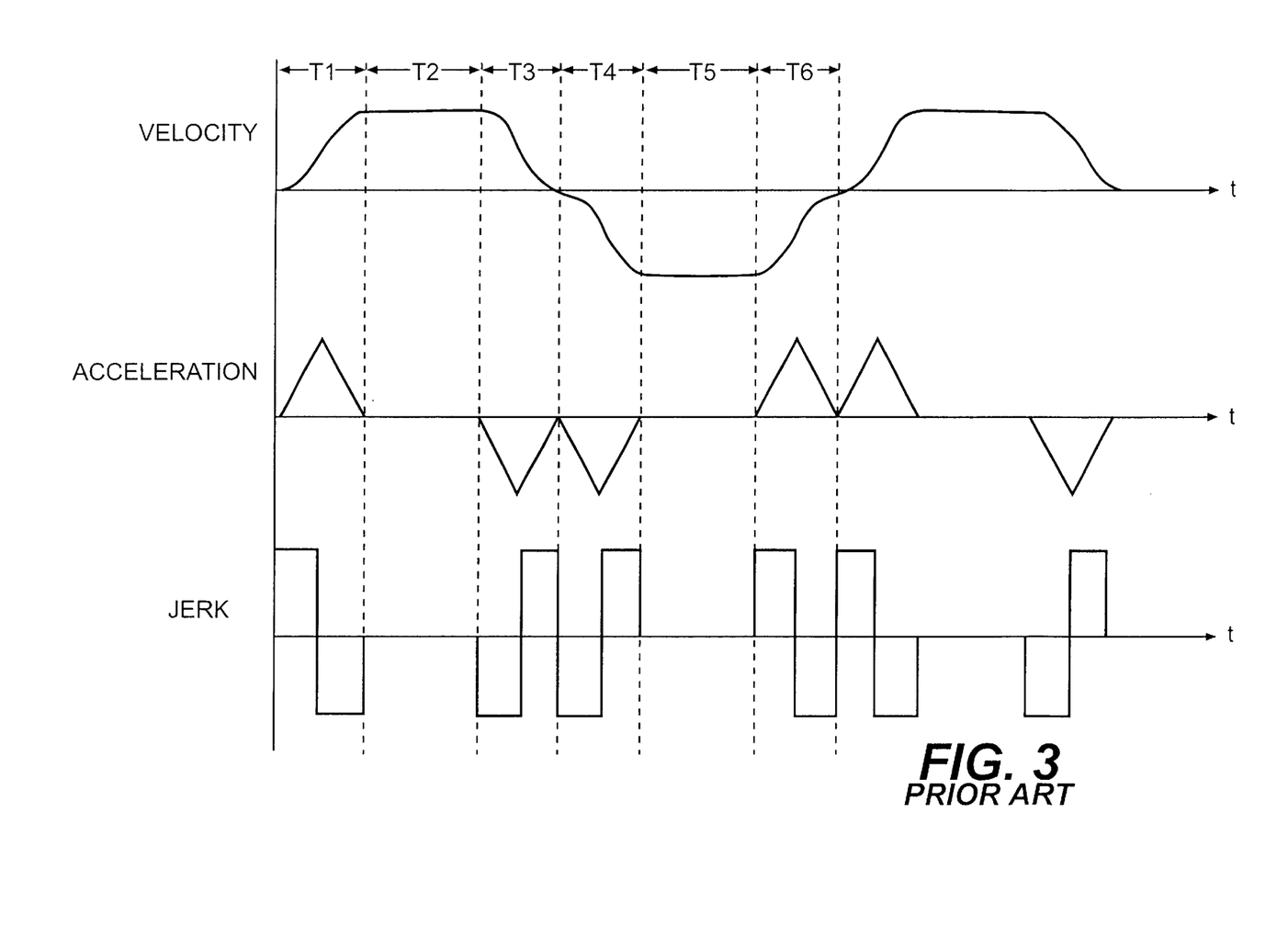
FIG. 3 is a velocity, acceleration, and jerk profile of a wafer stage or a reticle stage during a conventional scanning exposure.

A conventional scanning exposure process of a step-and-scan system typically includes six discrete process steps to transfer the image of the pattern on the reticle to two shot areas on the wafer. FIG. 3 shows the velocity, acceleration, and jerk (rate of change of acceleration) profiles of a wafer stage and a reticle stage during these six steps. The steps include: (1) acceleration of the wafer and reticle stages to a positive scanning velocity during time period T1; (2) scanning of a first shot area of the wafer at constant velocity in the +X direction during a time period T2; (3) deceleration of the wafer and reticle stages to zero velocity during a time period T3; (4) acceleration of the wafer and reticle stages to a negative scanning velocity during a time period T4; (5) scanning of a second shot area of the wafer at constant velocity in the −X direction during a time period T5; and (6) deceleration of the wafer and reticle stages to zero velocity during a time period T6. These six steps are repeated until the entire reticle image pattern has been transferred onto all shot areas of the wafer.

During process steps 3 and 4, the wafer and reticle are stepped in the Y direction so that the scanning during step 5 is of the second shot area. In addition, conventional process steps 3 and 4 are discrete, separate steps that occur in sequence. Between these two steps, the values of the accelerations of the wafer stage and the reticle stage reach zero. Similarly, during process step 6 and its subsequent process step 1, the wafer and reticle are stepped in the Y direction so that the scanning during step 2 is of a subsequent shot area. Once again, conventional process steps 6 and 1 are discrete, separate steps that occur in sequence. Between these two steps, the values of the accelerations of the wafer stage and the reticle stage reach zero.

The velocity, acceleration, and jerk profiles shown in FIG. 3 are similar for both the wafer and reticle stages, with the exception that the reticle stage requires a higher magnitude of velocity due to the relative sizes of the reticle image pattern and the wafer shot areas, as discussed earlier. For this reason, the peak accelerations for the reticle stage and the magnitude of jerk will be higher for the reticle stage as opposed to the wafer stage. It is also to be understood that the acceleration profile has been simplified for ease of demonstration. During actual scanning, the acceleration profile is somewhat more complicated than the triangular acceleration profile shown.

As described earlier, no scanning occurs during the time between scans. During this time period (represented by T3+T4 and T6+T1), the wafer and reticle stages are stepped in the Y direction, and the stages are decelerated to zero velocity and then accelerated in the opposite direction to a constant scanning velocity. The inefficiency represented by the time periods T3+T4 and T6+T1 increases the total time to manufacture a chip on a wafer and thereby limits the throughput of wafers in a production process.

Figure 4:
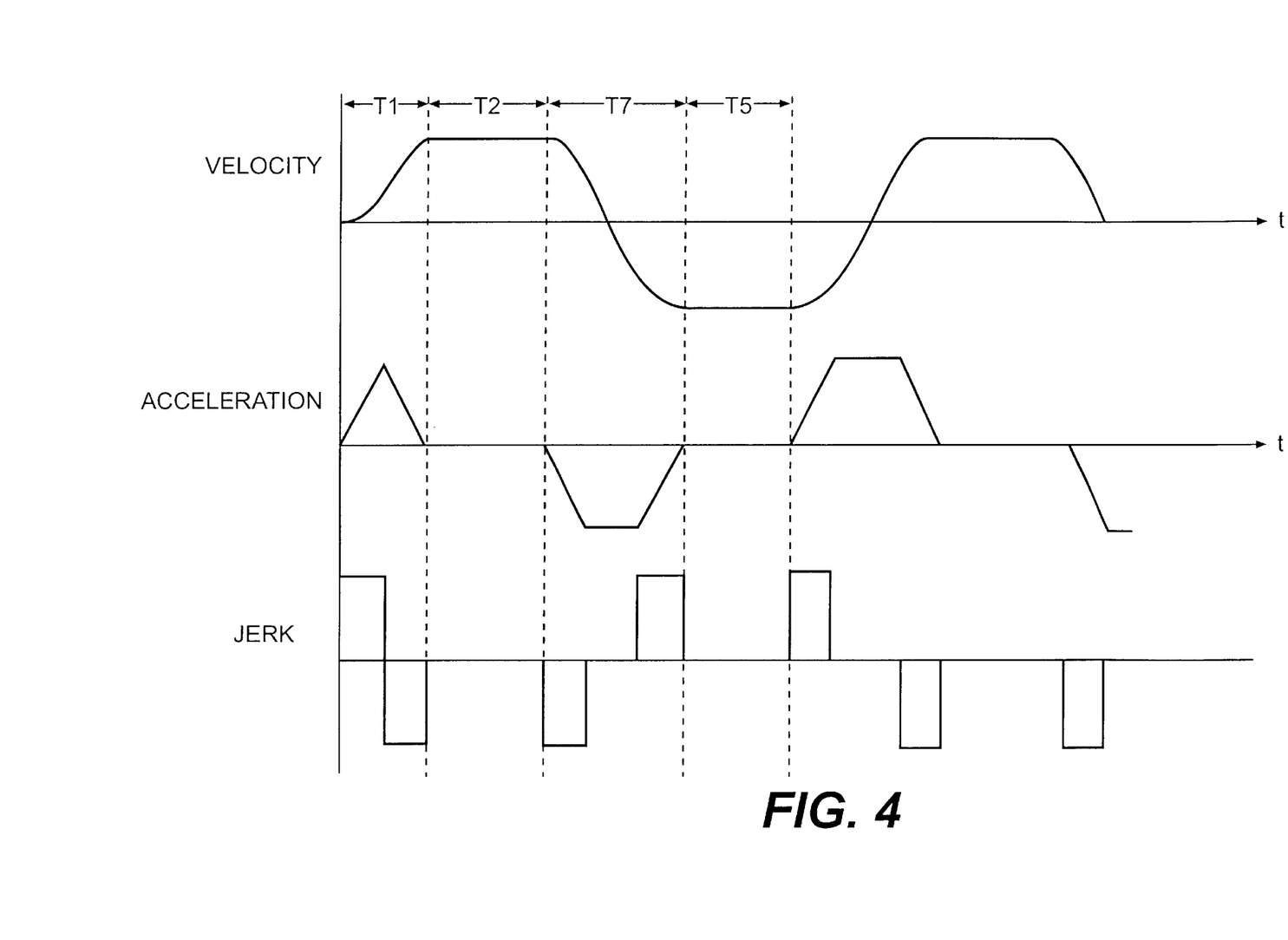
FIG. 4 is a velocity, acceleration, and jerk profile of a wafer stage or a reticle stage during a scanning exposure according to a first embodiment of a step-and-scan method according to the present invention.

This inefficiency is minimized according to the present invention by incorporating a single, continuous deceleration and acceleration step in place of the two discrete, back-to-back deceleration and acceleration steps between scans (i.e. the steps during which a change in direction occurs and the wafer and/or reticle stage is stepped). For example, FIG. 4 shows the velocity, acceleration, and jerk profiles of a reticle stage or a wafer stage during a scanning exposure according to a first embodiment of a step-and-scan method and system of the present invention. Certain process steps of the scanning exposure of this embodiment are the same as the process steps of the conventional scanning exposure profiled in FIG. 3 and described above. For example, scan steps 2 and 5 (corresponding to time periods T2 and T5 respectively) are the same for the inventive scanning exposure profiled in FIG. 4 and the conventional scanning exposure profiled in FIG. 3. In addition, the initial acceleration to scan a first shot area of a wafer and the final deceleration after scanning the last shot area of that wafer are the same as in a conventional scanning exposure method.

However, between scans, the step-and-scan method profiled in FIG. 4 includes a single, continuous deceleration and acceleration process step. That single step takes the wafer or reticle stage from the constant scanning stage velocity in one direction to the constant scanning stage velocity in the opposite direction. In addition, that single step is characterized in that the acceleration of the wafer or reticle stage never reaches a value of zero. In other words, the acceleration continually has an absolute value greater than zero.

For example, between the end of scanning period T2 and the beginning of scanning period T5, a single, continuous method step decelerates the wafer or reticle stage to zero velocity and accelerates the stage to the constant negative scanning velocity. This occurs during time period T7. The acceleration never reaches a value of zero during time period T7. Similarly, between the end of scanning period T5 and the beginning of a subsequent scanning period, a single, continuous method step decelerates the wafer or reticle stage to zero velocity and accelerates the stage to the constant positive velocity for scanning a subsequent shot area.

The acceleration profile shown in the FIG. 4 embodiment has the same peak or magnitude of acceleration as the conventional profile shown in FIG. 3, but has a trapezoidal shape. Such acceleration retains the same magnitude of jerk and results in a velocity profile during the scanning steps (T2 and T5) that is identical to the conventional velocity profile. Thus, the dynamics of stage motion are not affected adversely by the single, continuous acceleration during time between scans, as compared to the two discrete steps of conventional step-and-scan systems.

However, because the constant scanning velocity during time period T2 changes to the constant scanning velocity during time period T5 at a much faster rate, the velocity profile between scans differs from the conventional profile. This results in a significant reduction in the time to scan and expose a shot area or chip on the wafer. This time reduction, in turn, results in an increase in wafer throughput.

Figure 5:
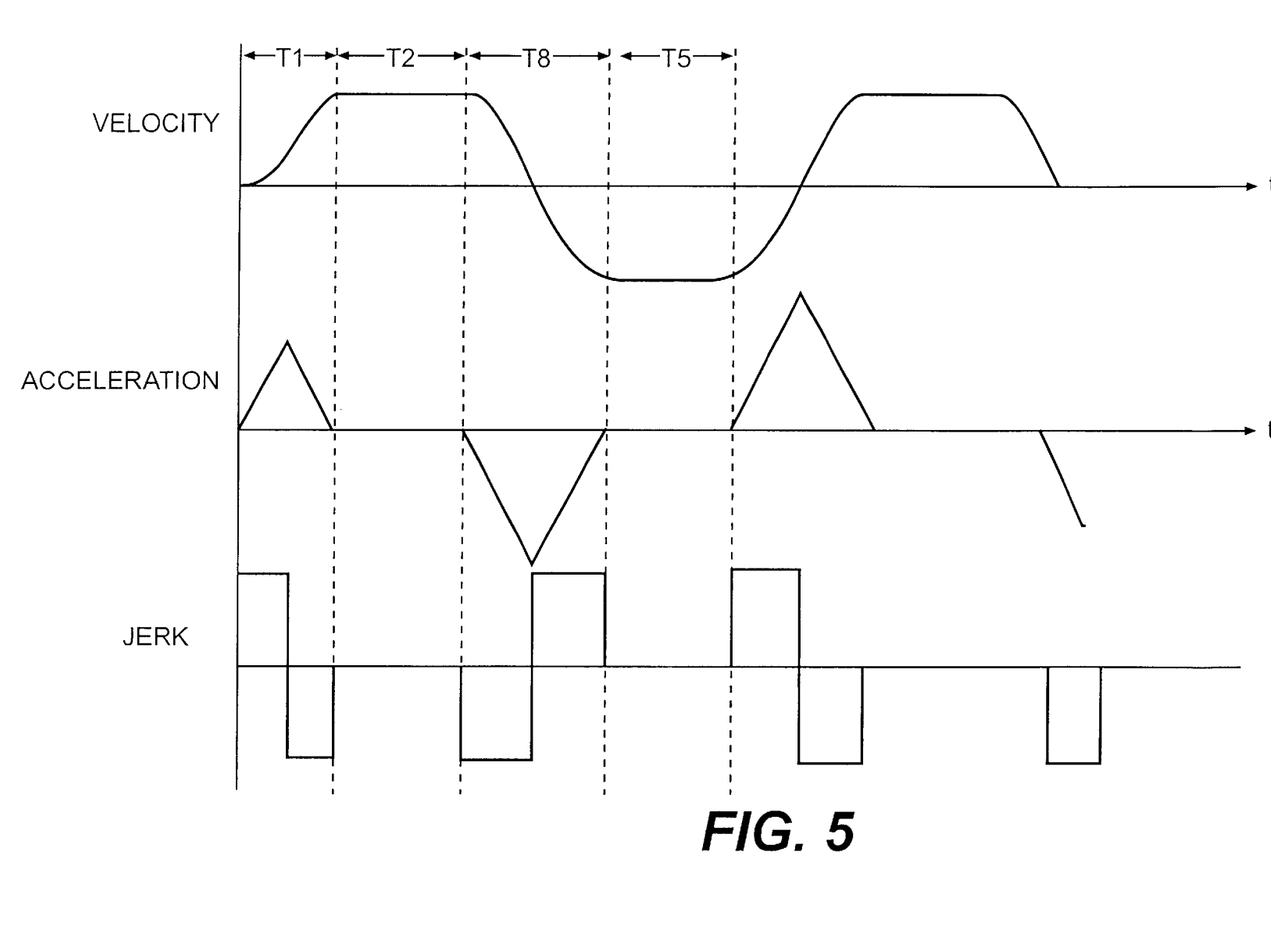
FIG. 5 is a velocity, acceleration, and jerk profile of a wafer stage or a reticle stage during a scanning exposure according to a second embodiment of a step-and-scan method according to the present invention.

FIG. 5 shows the velocity, acceleration, and jerk profiles of a reticle stage or a wafer stage during a scanning exposure according to a second embodiment of a step-and-scan method and system of the present invention. As in the FIG. 4 embodiment, certain process steps of the scanning exposure of this second embodiment are the same as the process steps of the conventional scanning exposure profiled in FIG. 3. Once again, scan steps 2 and 5 (corresponding to time periods T2 and T5, respectively) are the same for the inventive scanning exposure profiled in FIG. 5 and the scanning exposures profiled in FIGS. 3 and 4. In addition, the initial acceleration to scan a first shot area of a wafer and the final deceleration after scanning the last shot area of that wafer are the same.

However, between scans, the step-and-scan method profiled in FIG. 5 includes a single, continuous deceleration and acceleration process step. That single step takes the wafer or reticle stage from the constant scanning stage velocity in one direction to the constant scanning stage velocity in the opposite direction. In addition, that single step is characterized in that the acceleration of the wafer or reticle stage never reaches a value of zero. In other words, the acceleration continually has an absolute value greater than zero.

For example, between the end of scanning period T2 and the beginning of scanning period T5, a single, continuous method step decelerates the wafer or reticle stage to zero velocity and accelerates the stage to the constant negative scanning velocity. This occurs during time period T8. The acceleration never reaches a value of zero during time period T8. Similarly, between the end of scanning period T5 and the beginning of a subsequent scanning period, a single, continuous method step decelerates the wafer or reticle stage to zero velocity and accelerates the stage to the constant positive velocity for scanning a subsequent shot area.

Unlike the FIG. 4 embodiment, the acceleration profile shown in the FIG. 5 embodiment has a higher peak or magnitude of acceleration. However, the deceleration and acceleration during time period T8 occurs at the same rate of change of acceleration (i.e. magnitude of jerk) as the profiles of FIGS. 3 and 4. Such acceleration retains the same magnitude of jerk and results in a velocity profile during the scanning steps (T2 and T5) that is identical to the conventional velocity profile. Thus, the dynamics of stage motion are not affected adversely by the single, continuous acceleration between scans, as compared to the two discrete steps of conventional step-and-scan systems.

Like the FIG. 4 embodiment, however, because the constant scanning velocity during time period T2 changes to the constant scanning velocity during time period T5 at a much faster rate, the velocity profile between scans differs from the conventional profile. This results in a significant reduction in the time to scan and expose a shot area or chip on the wafer. The higher peak deceleration profiled in FIG. 5 reduces that time even more than the time required in the first embodiment.

The first and second embodiments of a step-and-scan method and system according to the present invention represent presently preferred embodiments. Other step-and-scan methods and systems incorporating single, continuous acceleration profiles during the change in direction of scanning are within the scope of the invention. For example, 1) Multiple sub fields on a single reticle to expose multiple shot areas. 2) Direct write EB system with no reticle but where wafer is scanned. 3) Inspection system where nothing is being exposed.

Main control system 12 must be programmed accordingly to implement the step-and-scan method according to the present invention into a projection exposure apparatus, such as the apparatus shown in FIG. 1. Main control section 12 controls the positioning of the reticle and wafer stages. All other aspects of a conventional apparatus may remain the same.

For example, the desired trajectory, or positions, that the wafer and/or reticle need to follow during the entire scanning exposure process may be input into memory 17 via input device (keyboard) 16. Main control system 12 includes software to control the movement of the reticle and wafer stages according to the desired velocity, acceleration, and jerk profiles. Such software may be developed by one skilled in the art according to known programming methods.

An appropriate feedback loop would determine the current position of the wafer, for example, and send that information to main control system 12. Control system 12 would then determine the desired position of the wafer from memory 17. Then, according to the profiles programmed into main control system 12, control system 12 would cause drive section 15 to move the wafer stage so as to correctly position the wafer. Similar feedback loops for controlling projection exposure apparatuses are well known in the art.

Figure 6:
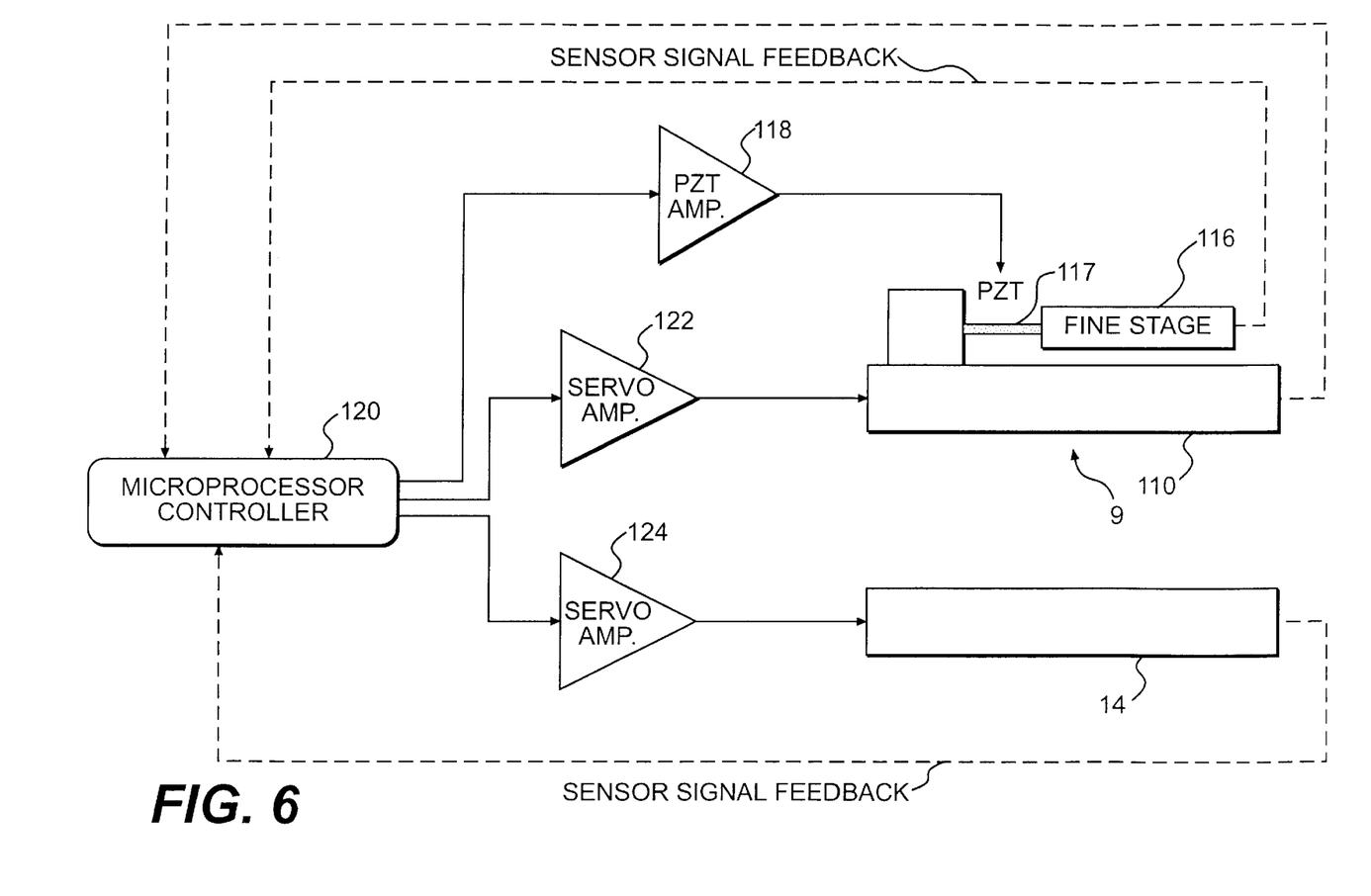
FIG. 6 is a schematic diagram of an embodiment of a control system for use in a step-and-scan method according to the present invention.
Figure 7:
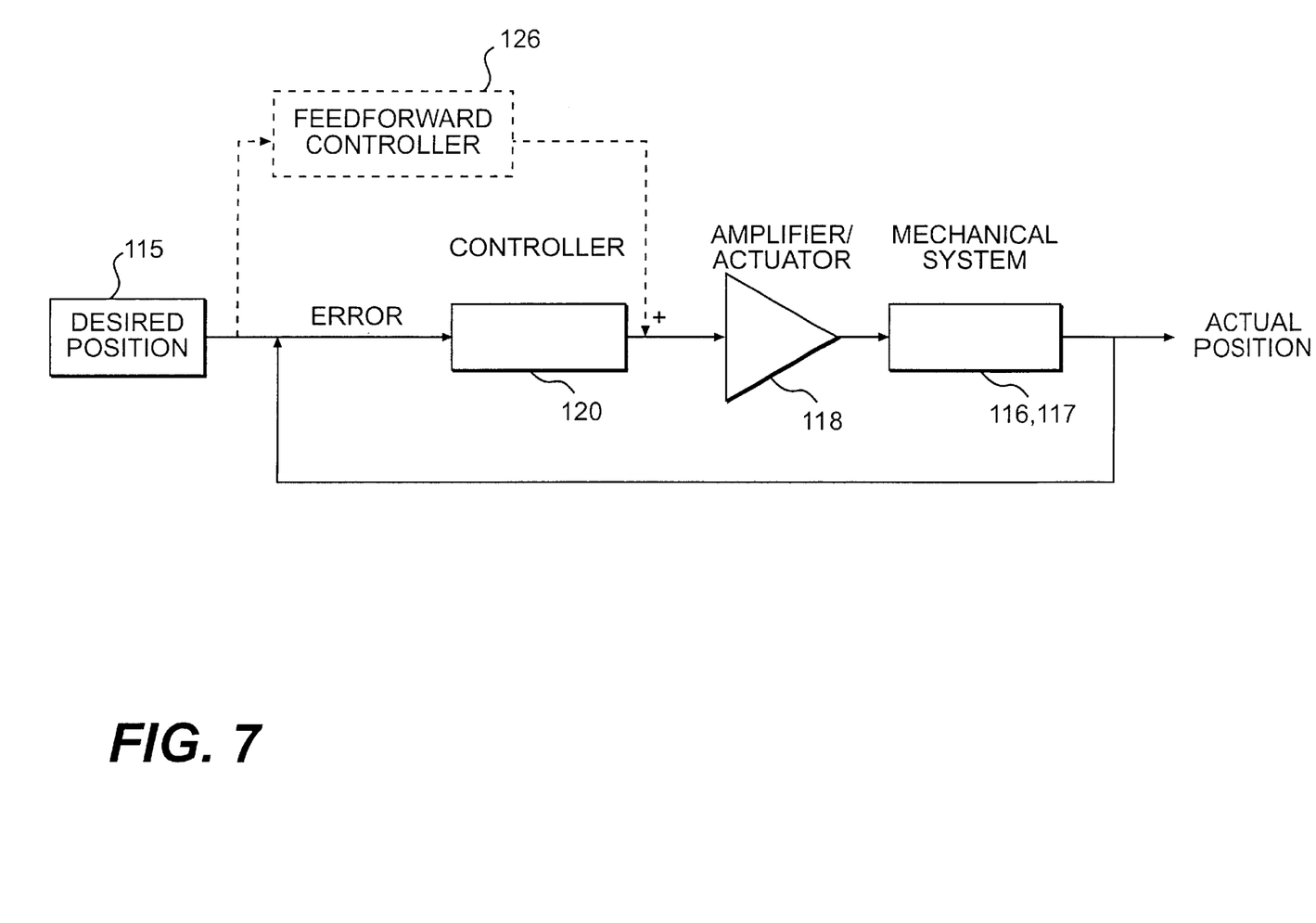
FIG. 7 is a feedback loop for a reticle stage according to the control system of FIG. 6.

For example, FIGS. 6 and 7 schematically show a more detailed description of a feedback loop for controlling a projection exposure apparatus according to the present invention. As shown in FIG. 6, a microprocessor controller 120 (part of the main control system 12) receives feedback signals from reticle stage 9 and wafer stage 14. Reticle stage 9 includes a coarse stage 110 and a fine stage 116 for fine position adjustments of reticle stage 9. The feedback signals received by controller 120 indicate the actual position of wafer stage 14, coarse stage 110, and fine stage 116. Controller 120 includes software to control the movement of reticle stage 9 and wafer stage 14 according to the desired velocity, acceleration, and jerk profiles. Based on the feedback position signals, the desired position of the reticle and wafer stages, and the velocity, acceleration, and jerk profiles, controller 120 sends signals to various amplifiers to drive wafer stage 14 and reticle stage 9. Servo amplifiers 122 and 124 drive wafer stage 14 and reticle coarse stage 110 respectively. A PZT amplifier 118 drives a PZT 117 for fine adjustments of reticle fine stage 116.

FIG. 7 shows a feedback loop for controlling the position of reticle fine stage 116. It is to be understood that the feedback loops for controlling coarse stage 110 and wafer stage 14 are similar. A trajectory signal 115 indicating the desired stage positions is input into a memory. Trajectory signal 115 includes the desired position from the profiles in FIG. 3, 4, or 5. Trajectory signal 115 is fed to controller 120. At the same time, a signal representing the actual position of fine stage 116 is fed to controller 120. Controller 120 determines an error or difference between the desired position indicated by trajectory signal 115 and the actual position. Then, controller 120 sends a signal to amplifier 118 to actuate PZT 117 and fine stage 116 to move the reticle to the desired position. A feedforward controller 126 may also be incorporated into FIG. 7, as shown in broken line.

The control system shown in FIGS. 6 and 7 represents one embodiment of a control system that may be used to implement the step-and-scan method according to the present invention. Other control systems known in the art for controlling a projection exposure apparatus may be used without departing from scope of this invention. For example, controller 120 may be a PID filter, a lead-lag filter, or other type of filter.

Furthermore, although the invention has been described in terms of a step-and-scan exposure apparatus and method, the principles described herein may be applied in any positioning apparatus and method.

When using a linear motor for the wafer stage or the reticle stage (see U.S. Pat. No. 5,623,853 or U.S. Pat. No. 5,528,118), either an air-floating model that employs air bearings or a magnetic floating model that employs Lorentz's force or actance force can be used. The stage can either be a type that moves along a guide or a type that has no guide (guideless).

A plane motor that drives the stage using electromagnetic force by using a magnet unit having magnets sited two-dimensionally opposite an armature unit in which a coil is sited two-dimensionally. If so, either the magnet unit or armature unit can be connected to the stage, and the other can be installed on the moving side of the stage.

The reactive force produced by the movement of the wafer stage may be mechanically displaced to the bed (the ground) using the frame materials, as described in patent application H8 [1996]-166475 (U.S. Pat. No. 5,528,118).

The reactive force produced by the movement of the reticle stage may be mechanically displaced to the bed (the ground) using the frame materials, as described in patent application H8 [1996]-330224 (U.S. Pat. No. 5,874,820).

It will be apparent to those skilled in the art that various modifications and variations can be made to the exposure methods of the present invention without departing from the scope or spirit of the invention. Thus, it is intended that the present invention cover the modifications and variations of this invention provided they come within the scope of the appended claims and their equivalents.

What is claimed is:

1. A step-and-scan exposure method comprising the steps of:

disposing a first shot area of a substrate under a projection optical system;

exposing a first pattern onto the first shot area through the projection optical system, wherein the substrate moves at a first constant velocity during exposure of the first pattern onto the first shot area;

moving the substrate from a first position where the exposure of the first pattern onto the first shot area has finished to a second position where the exposure of a second pattern onto a second shot area is to start, wherein an acceleration of the substrate during movement from the first position to the second position continually has an absolute value greater than zero; and exposing the second pattern onto the second shot area, wherein the substrate moves at a second constant velocity during exposure of the second pattern onto the second shot area.

2. A step-and-scan exposure method comprising the steps of:

disposing a first shot area of a substrate under a projection optical system;

exposing a first pattern onto the first shot area through the projection optical system;

moving the substrate from a first position where the exposure of the first pattern onto the first shot area has finished to a second position where the exposure of a second pattern onto a second shot area is to start, wherein an acceleration of the substrate during movement from the first position to the second position continually has an absolute value greater than zero and includes a deceleration stage and an acceleration stage, wherein an absolute value of a velocity of the substrate reduces to zero during the deceleration stage and increases from zero during the acceleration stage; and moving the substrate in a first direction during the deceleration stage and a second opposite direction during the acceleration stage.

3. A step-and-scan exposure method in which patterns on a mask are transferred to shot areas on a photosensitive substrate by a series of scanning exposures, the method comprising the steps of:

disposing a first pattern above a projection optical system;

exposing the first pattern onto a first shot area through the projection optical system, wherein the mask moves at a first constant velocity during exposure of the first pattern onto the first shot area;

moving the mask from a first position where the exposure of the first pattern has finished to a second position where the exposure of a second pattern onto a second shot area is to start, wherein an acceleration of the mask during movement from the first position to the second position continually has an absolute value greater than zero; and exposing the second pattern onto the second shot area, wherein the mask moves at a second constant velocity during exposure of the second pattern onto the second shot area.

4. A step-and-scan exposure method in which patterns on a mask are transferred to shot areas on a photosensitive substrate by a series of scanning exposures, the method comprising the steps of:

disposing a first pattern above a projection optical system;

exposing the first pattern onto a first shot area through the projection optical system;

moving the mask from a first position where the exposure of the first pattern has finished to a second position where the exposure of a second pattern onto a second shot area is to start, wherein an acceleration of the mask during movement from the first position to the second position continually has an absolute value greater than zero and includes a deceleration stage and an acceleration stage, wherein an absolute value of a velocity of the mask reduces to zero during the deceleration stage and increases from zero during the acceleration stage; and moving the mask in a first direction during the deceleration stage and a, second opposite direction during the acceleration stage.

5. A method of moving a substrate comprising the steps of:

disposing a first area of the substrate under a system;

performing a first operation with respect to the first area, wherein the substrate moves at a first constant velocity during the first operation with respect to the first area;

moving the substrate from a first position where the first operation with respect to the first area has finished to a second position where a second operation with respect to a second area is to start, continually at an acceleration having an absolute value greater than zero; and performing the second operation with respect to the second area, wherein the substrate moves at a second constant velocity during the second operation with respect to the second area.

6. A method of moving a substrate comprising the steps of:

disposing a first area of the substrate under a system;

performing a first operation with respect to the first area;

moving the substrate from a first position where the first operation with respect to the first area has finished to a second position where a second operation with respect to a second area is to start, continually at an acceleration having an absolute value greater than zero, wherein the acceleration of the substrate during movement from the first position to the second position includes a deceleration stage and an acceleration stage, wherein an absolute value of a velocity of the substrate reduces to zero during the deceleration stage and increases from zero during the acceleration stage; and moving the substrate in a first direction during the deceleration stage and a second opposite direction during the acceleration stage.

7. A method of moving a system above a substrate in which operations are performed relative to areas of the substrate, comprising the steps of:

disposing the system above a first area of the substrate;

performing a first operation with respect to the first area, wherein the system moves at a first constant velocity during the first operation with respect to the first area;

moving the system from a first position where the first operation has finished to a second position where a second operation is to start, wherein an acceleration of the system during movement from the first position to the second position continually has an absolute value greater than zero; and performing the second operation with respect to a second area of the substrate, wherein the system moves at a second constant velocity during the second operation with respect to the second area.

* * * * *

UNITED STATES PATENT AND TRADEMARK OFFICE
CERTIFICATE OF CORRECTION

PATENT NO.    : 6,285,438 B1
DATED         : September 4, 2001
INVENTOR(S)   : Andrew Hazelton et al.

It is certified that error appears in the above-identified patent and that said Letters Patent is hereby corrected as shown below:

<u>Column 10,</u>
Line 40, after "and a", delete ",".

Signed and Sealed this

Thirtieth Day of April, 2002

Attest:

JAMES E. ROGAN
*Director of the United States Patent and Trademark Office*

*Attesting Officer*